United States Patent
Lin et al.

(10) Patent No.: US 11,227,919 B2
(45) Date of Patent: Jan. 18, 2022

(54) FIELD-EFFECT-TRANSISTORS

(71) Applicants: Semiconductor Manufacturing International (Shanghai) Corporation, Shanghai (CN); Semiconductor Manufacturing International (Beijing) Corporation, Beijing (CN)

(72) Inventors: Xi Lin, Shanghai (CN); Yi Hua Shen, Shanghai (CN); Jian Pan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/237,830

(22) Filed: Jan. 2, 2019

(65) Prior Publication Data

US 2019/0140057 A1    May 9, 2019

Related U.S. Application Data

(62) Division of application No. 15/477,394, filed on Apr. 3, 2017, now Pat. No. 10,211,203.

(30) Foreign Application Priority Data

Jun. 12, 2016 (CN) .......................... 201610407330.1

(51) Int. Cl.
*H01L 27/088* (2006.01)
*H01L 29/201* (2006.01)
(Continued)

(52) U.S. Cl.
CPC ...... *H01L 29/201* (2013.01); *H01L 21/02532* (2013.01); *H01L 21/02535* (2013.01);
(Continued)

(58) Field of Classification Search
CPC ... H01L 29/201; H01L 29/161; H01L 29/267; H01L 29/66356; H01L 29/6681;
(Continued)

(56) References Cited

U.S. PATENT DOCUMENTS 9,508,597 B1   11/2016 Liu et al.
2009/0072270 A1*  3/2009 Asbeck ............... H01L 29/24
                                                    257/190

(Continued)

FOREIGN PATENT DOCUMENTS

CN      105336772 A    2/2016
WO      2015147784 A1  10/2015

*Primary Examiner* — Meiya Li
(74) *Attorney, Agent, or Firm* — Anova Law Group, PLLC

(57) ABSTRACT

A field-effect-transistor includes forming a fin structure on a substrate, a gate structure formed across each fin structure and covering a portion of top and sidewall surfaces of the fin structure, a first doped layer, made of a first semiconductor material and doped with first doping ions, in each fin structure on one side of the corresponding gate structure, and a second doped layer, made of a second semiconductor material, doped with second doping ions, and having doping properties different from the first doped layer, in each fin structure on another side of the corresponding gate structure.

10 Claims, 7 Drawing Sheets

(51) Int. Cl.
*H01L 29/161* (2006.01)
*H01L 29/267* (2006.01)
*H01L 29/66* (2006.01)
*H01L 29/739* (2006.01)
*H01L 21/8238* (2006.01)
*H01L 21/02* (2006.01)
*H01L 21/311* (2006.01)
*H01L 21/8234* (2006.01)
*H01L 29/78* (2006.01)

(52) U.S. Cl.
CPC .. *H01L 21/02546* (2013.01); *H01L 21/31116* (2013.01); *H01L 21/823418* (2013.01); *H01L 21/823431* (2013.01); *H01L 21/823437* (2013.01); *H01L 21/823468* (2013.01); *H01L 21/823814* (2013.01); *H01L 21/823821* (2013.01); *H01L 27/0886* (2013.01); *H01L 29/161* (2013.01); *H01L 29/267* (2013.01); *H01L 29/6681* (2013.01); *H01L 29/66356* (2013.01); *H01L 29/66818* (2013.01); *H01L 29/7391* (2013.01); *H01L 29/785* (2013.01)

(58) Field of Classification Search
CPC ........... H01L 29/66818; H01L 29/7391; H01L 29/785; H01L 21/02532; H01L 21/02535; H01L 21/02546; H01L 21/31116; H01L 21/823418; H01L 21/823431; H01L 21/823437; H01L 21/823468; H01L 21/823814; H01L 21/823821; H01L 27/0886

See application file for complete search history.

(56) References Cited

U.S. PATENT DOCUMENTS

| | | |
|---|---|---|
| 2013/0270652 A1* | 10/2013 | Liaw .................. H01L 27/1104 257/401 |
| 2014/0175381 A1 | 6/2014 | Goh et al. |
| 2015/0179800 A1* | 6/2015 | Biswas ............... H01L 29/7855 365/189.011 |
| 2016/0268401 A1 | 9/2016 | Aleksov et al. |
| 2016/0293756 A1 | 10/2016 | Liu et al. |
| 2017/0084722 A1 | 3/2017 | Lu et al. |
| 2017/0141111 A1 | 5/2017 | Deng et al. |
| 2019/0348501 A1* | 11/2019 | Glass .................... H01L 29/165 |

* cited by examiner

FIELD-EFFECT-TRANSISTORS

CROSS-REFERENCES TO RELATED APPLICATIONS

This application is a divisional of U.S. patent application Ser. No. 15/477,394, filed on Apr. 3, 2017, which claims the priority of Chinese Patent Application No. CN201610407330.1, filed on Jun. 12, 2016, the entire content of which is incorporated herein by reference.

FIELD OF THE DISCLOSURE

The present disclosure generally relates to the field of semiconductor fabrication technology and, more particularly, relates to field-effect-transistors.

BACKGROUND

With the development of integrated circuits towards very-large-scale integration (VLSI), the circuit density in an integrated circuit becomes higher, the quantity of semiconductor components included in the integrated circuit is increased, and the sizes of semiconductor components are also reduced. As the sizes of semiconductor structures become smaller, channel lengths of devices in semiconductor structures are also reduced. Because of the reduction of channel lengths, gradual channel approximation (GCA) is no longer valid and various adverse physical effects become more prominent. Therefore, the performance and the reliability of the devices may be degraded, and further reducing the sizes of the devices may be difficult.

With the progress in device manufacturing technology, the sizes of devices are reduced, and the working voltages of semiconductor devices also become lower and lower. In a traditional device with a metal-oxide-semiconductor (MOS) structure, the subthreshold swing may not be lower than 60 mV/dec. Such a minimum value of the subthreshold swing may limit the lowest working voltage of traditional complementary metal-oxide-semiconductor (CMOS) devices.

Currently, in order to further reduce the lowest working voltage of CMOS devices, various new types of devices have been provided to break the limitation on the subthreshold swing. For example, one type of such devices is tunneling field-effect-transistor (TFET). TFET is a transistor based on quantum tunneling effect and using a tunneling current as the major component of the current in the transistor structure. In a certain voltage range, the subthreshold swing of TFET may be reduced to 15 mV/dec. Therefore, TFET may demonstrate advanced characteristics such as low power, high working efficiency, etc.

However, the fabrication process for the source regions and the drain regions in existing FETs may be greatly limited, and thus may affect the improvement of the performance of the FETs. The disclosed FETs and the fabrication methods are directed to solve one or more problems set forth above and other problems in the art.

BRIEF SUMMARY OF THE DISCLOSURE

One aspect of the present disclosure includes a method for fabrication a field-effect-transistor. The method includes forming a plurality of fin structures on a substrate, forming a gate structure across each fin structure and covering a portion of top and sidewall surfaces of the fin structure, forming a first doped layer, made of a first semiconductor material and doped with first doping ions, in each fin structure on one side of the corresponding gate structure, and forming a second doped layer, made of a second semiconductor material, doped with second doping ions, and having doping properties different from the first doped layer, in each fin structure on another side of the corresponding gate structure.

Another aspect of the present disclosure provides a transistor. The transistor includes a substrate, a fin structure formed on the substrate, a gate structure formed across each fin structure and covering a portion of top and sidewall surfaces of the fin structure, a first doped layer formed in each fin structure on one side of the corresponding gate structure and made of a first semiconductor material and doped with first doping ions, and a second doped layer formed in the fin structure on another side of the gate structure, made of a second semiconductor material, doped with second doping ions, and having doping properties different from the first doped layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

For existing TFETs, the fabrication process for the source regions and the drain regions may affect the improvement of the performance of the TFETs. In the following, an example will be provided to illustrate the problem in the fabrication process for the source regions and the drain regions in existing TFETs.

Figure 1:
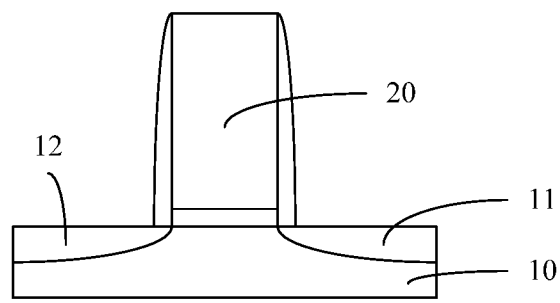
FIG. 1 illustrates a schematic cross-section view of an existing transistor.

FIG. 1 shows a schematic cross-section view of an existing TFET. Referring to FIG. 1, the fabrication process for the TFET includes providing a substrate 10, forming a gate structure 20 on the surface of the substrate 10, and forming a first doped layer 11 and a second doped layer 12 in the substrate 10 on the two sides of the gate structure 20. The first doped layer 11 and the second doped layer 12 respectively serve as the source region and the drain region of the subsequently-formed transistor.

For a conventional transistor, the material used to form the source region may be the same as the material used to form the drain region and the properties of the dopants in the source region and the properties of the dopants in the drain region may also be the same. Therefore, the gate structure 20 is commonly used as an etch mask to simultaneously form the first doped layer 11 and the second doped layer 12 during the fabrication process of the TFET.

The source-channel-drain in a TFET is usually a P-I-N structure. Therefore, the requirements on the doping type and the doping material in the source region may be different from the requirements on the doping type and the doping material in the drain region. Therefore, when the source region and the drain region are simultaneously formed during the formation of the TFEF, the process to form the source region may affect the material and the doping properties in the drain region, and vice versa. Therefore, the selection ranges for the materials and the doping properties in the source region and in the drain region may be limited, which may be detrimental to the performance optimization for the TFET.

Figure 15:
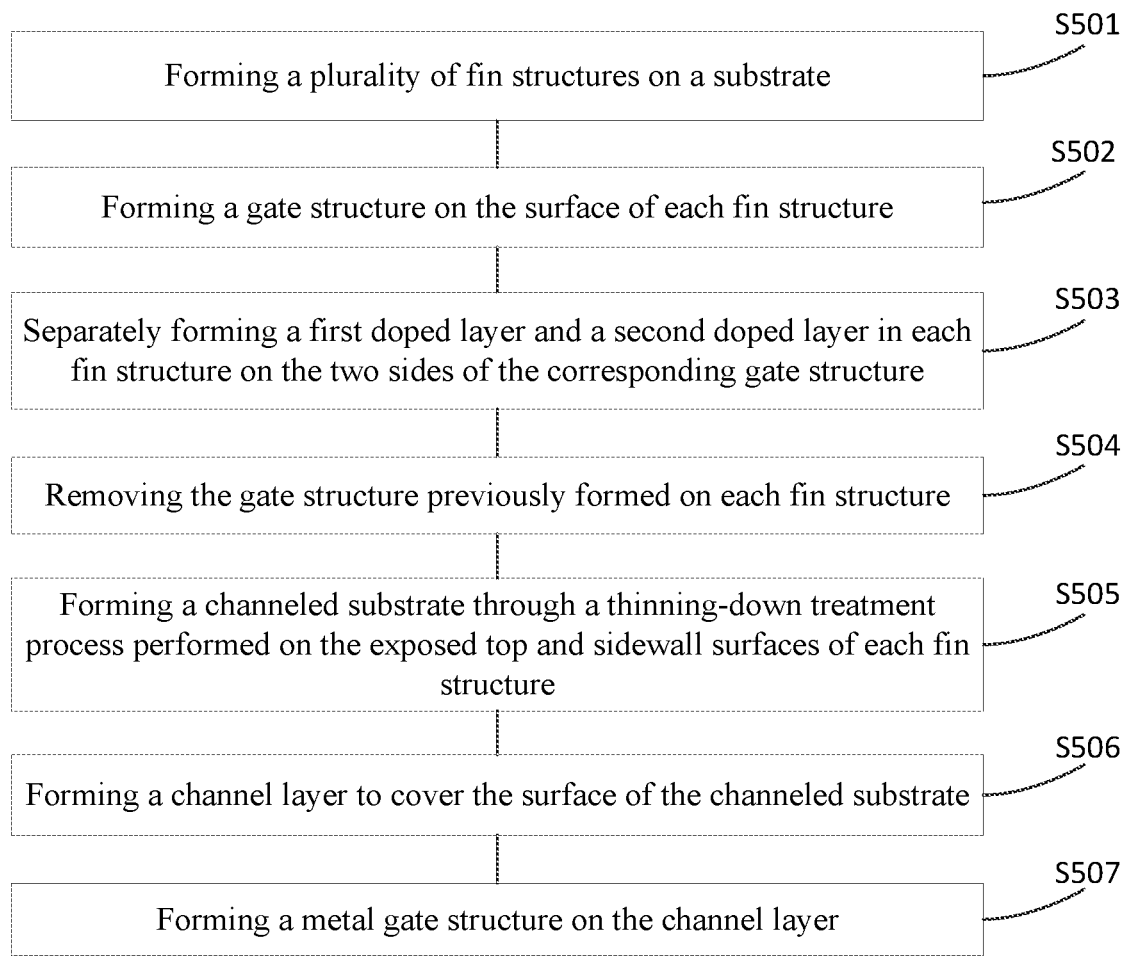
FIG. 15 illustrate a flowchart of an exemplary fabrication process consistent with disclosed embodiments.

The present disclosure provides a transistor and a fabrication method for the transistor to improve the selection ranges for the materials and the doping properties in the source region and the drain region. FIG. 15 shows a flowchart of an exemplary fabrication process consistent with disclosed embodiments. FIGS. 2-12 show schematic cross-section views of semiconductor structures corresponding to certain stages of the fabrication process of the TFET.

Figure 2:
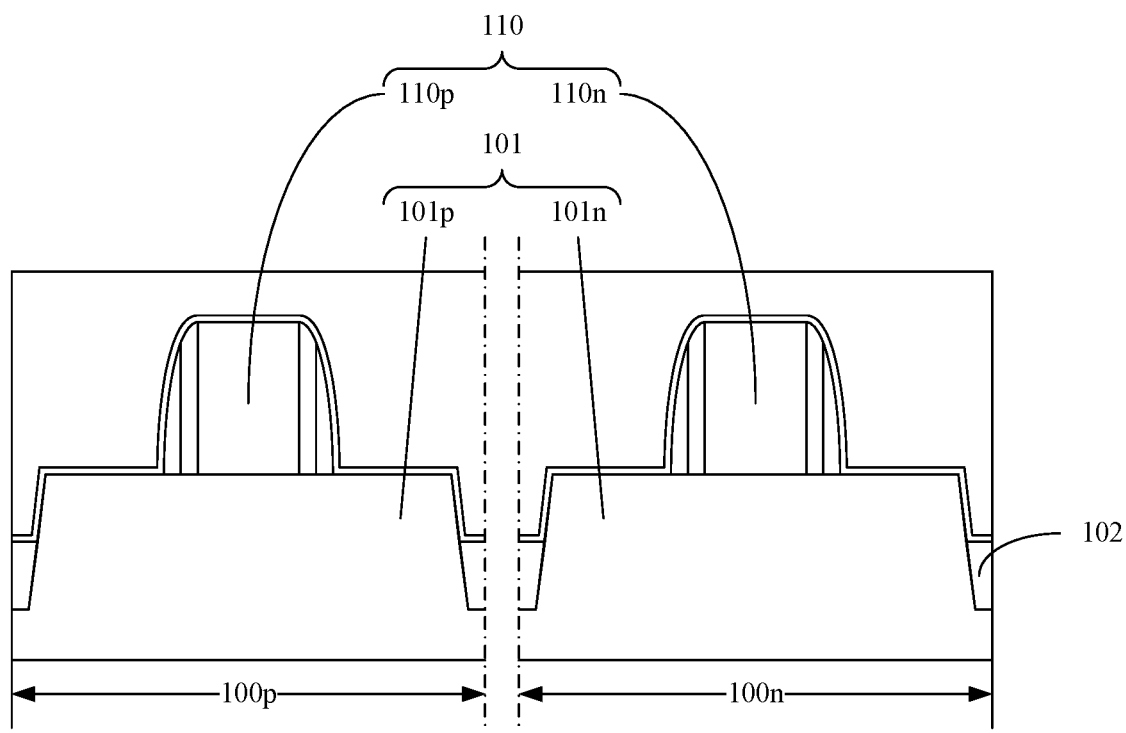
FIGS. 2-12 illustrate schematic cross-section views of semiconductor structures corresponding to certain stages of an exemplary fabrication process for a transistor consistent with disclosed embodiments.

Referring to FIG. 15, at the beginning of the fabrication process, a substrate with a plurality of fin structures formed on the substrate may be provided (S501). FIG. 2 shows a schematic cross-section view of the corresponding semiconductor structure.

Referring to FIG. 2, a substrate is provided. A plurality of fin structures 101 may be formed on the surface of the substrate. In one embodiment, the transistors to be formed are TFETs. In other embodiments, the disclosed fabrication method may also be used to form transistors having any other appropriate structure.

The substrate may provide an operation platform for the subsequent semiconductor process. The plurality of fin structures 101 may be used to form the transistors. Forming the plurality of fin structures 101 on the substrate may include providing a semiconductor substrate and then forming the plurality of fin structures 101 on the surface of the substrate by etching the semiconductor substrate.

The semiconductor substrate may be made of single crystalline silicon, polycrystalline silicon, or amorphous silicon. In addition, the semiconductor substrate may be made of Ge, GaAs, or SiGe. Moreover, the semiconductor substrate may also be made of any other appropriate semiconductor material.

Moreover, the semiconductor substrate may be a structure having an epitaxial layer or having silicon on an epitaxial layer. For example, the semiconductor substrate may include a substrate and a semiconductor layer formed on the surface of the substrate. The semiconductor layer may be formed on the surface of the substrate by a selective epitaxial deposition process. The substrate may be made of silicon, SiGe, SiC, silicon on insulator (SOI), germanium on insulator (GOI), glass, or a Group III-V compound such as GaN and GaAs, etc. The semiconductor layer may be made of silicon, Ge, SiC, SiGe, or any other appropriate semiconductor material. The materials of the substrate and the semiconductor layer may not be limited to any specific selections. The selected materials for the substrate and the semiconductor layer may satisfy the process requirements. The selection for the substrate may be easily adapted to integration and the material for the semiconductor layer may be suitable for forming fin structures. Moreover, the thickness of the semiconductor layer may be controlled by the epitaxial process so that the height of the fin structures formed subsequently from the semiconductor layer may be precisely controlled.

In one embodiment, the semiconductor substrate is made of single crystalline silicon. Thus, the substrate and the fin structures 101 are both made of single crystalline silicon. In addition, the TFETs formed subsequently are Fin-FETs. Therefore, a first doped layer and a second doped layer may be formed in each fin structure 101, and the first doped layer and the second doped layer may be used to respectively form the source region and the drain region of the corresponding transistor. By using single crystalline silicon for the substrate and also for the fin structure 101, structural defects in the formed first doped layer and the second doped layer may be reduced, which may be conducive to improving the quality of the first doped layer and the second doped layer, and may also help improve the performance of the formed TFET.

Moreover, by using single crystalline silicon for the substrate and the fin structure 101, the disclosed fabrication method may be compatible with existing main-stream transistor fabrication technology and, thus, no significant changes may be required for existing production lines in order to realize the disclosed fabrication method. That is, neither extra fabrication process nor extra cost may be required to fabricate the disclosed transistor.

The fabrication process for the fin structures 101 may include the following steps. First, a first patterned layer may be formed on the surface of the semiconductor substrate. The first patterned layer may be used to define the position and the size of the fin structures 101. Further, the substrate and the plurality of fin structures 101 may then be simultaneously formed from the semiconductor substrate by etching the semiconductor substrate using the first patterned layer as an etch mask.

The first patterned layer may be a patterned photoresist layer formed by a photoresist spin-coating process followed by a photolithography process. In addition, the first patterned layer may also be formed by a multi-patterning mask process in order to reduce the dimension of the fin structures 101 and/or reduce the distance between neighboring fin structures 101. The multi-patterning mask process may include self-aligned double patterned (SaDP) process, self-aligned triple patterned (SaTP) process, self-aligned double double patterned (SaDDP) process, etc.

In one embodiment, after forming the fin structures 101, in order to ensure electrical isolation between neighboring fin structures, the fabrication process may further include forming an isolation layer 102 on the substrate between neighboring fin structures 101. The top surface of the isolation layer 102 may be lower than the top surface of the fin structures 101 such that a portion of the sidewall surfaces of the fin structures 101 may be exposed.

In one embodiment, the substrate may be used to form a plurality of complementary metal-oxide-semiconductor (CMOS) structures. Therefore, the substrate may include a plurality of first regions 100*p* and a plurality of second regions 100*n*. For illustration purposes, the semiconductor structure shown in FIG. 2 is describe to have only one first region 100*p* and one second region 100*n*. In other embodiments, the number of the first regions 100*p* and the number of the second regions 100*n* may be more than one. The first regions 100*p* may be used to form first type transistors while the second regions 100*n* may be used to form second type transistors. For example, each first type transistor may be a P-type TFET and each second type transistor may be an N-type TFET. Further, the fin structures 101 formed on the surface of the substrate in the first regions 100p may be first fin structures 101p while the fin structures 101 formed on the surface of the substrate in the second regions 100n may be second fin structures 101n.

Further, returning to FIG. 15, a gate structure may be formed on the surface of each fin structure (S502). Referring to FIG. 2, a gate structure 110 may be formed on the surface of each fin structure 101. The gate structure 110 may be formed to across the corresponding fin structure 101 and cover a portion of the top and the sidewall surfaces of the fin structure 101.

The gate structure 110 may be used to cover a portion of the fin structure 101 during the subsequent process to form a first doped layer and a second doped layer. Thus, damage to the portion of the fin structure 101 covered by the gate structure 110 may be reduced. In one embodiment, the transistors to be formed may be high-k metal gate (HKMG) transistors. Therefore, the gate structure 110 may be a dummy gate structure, and the gate structure 110 may thus be used to define the dimension and the position of the metal gate formed subsequently.

In one embodiment, the gate structure 110 may be made of polycrystalline silicon. The process for forming the gate structure 110 may include the following steps. First, a gate electrode material layer may be formed on the surface of the substrate and the fin structure 101. Then, a second patterned layer may be formed on the surface of the gate electrode material layer. The second patterned layer may be used to define the dimension and the position of the gate structure to be formed. Further, the gate structure may be formed by etching the gate electrode material layer using the second patterned layer as an etch mask.

Similar to the first patterned layer, the second patterned layer may be a patterned photoresist layer formed by a photoresist spin-coating process followed by a photolithography process. In addition, the second patterned layer may also be formed by a multi-patterning mask process in order to reduce the dimension of the gate structures 110 and improve the integration level of the transistors.

In one embodiment, the fin structure 101 formed on the surface of the substrate in the first region 100p is a first fin structure 101p and the fin structure 101 formed on the surface of the substrate in the second region 100n is a second fin structure 101n. Accordingly, the fabrication process for the gate structures may include forming a first gate structure 110p on the surface of the first fin structure 101p and a second gate structure 110n on the surface of the second fin structure 101n.

In one embodiment, after forming the gate structures 110, the fabrication process may further include forming an offset spacer (not labeled), made of $SiN_x$, on each sidewall of each gate structure 110, and forming a sidewall (not labeled), made of $SiO_x$, on the surface of each offset spacer. The fabrication process may then include forming a protection layer and an interlayer dielectric layer to cover the fin structures 101, the isolation layer 102, and the gate structures 110 (not labeled). The protection layer may be made of $SiN_x$ and any other appropriate material while the interlayer dielectric layer may be made of $SiO_x$ and any other appropriate material.

Further, returning to FIG. 15, a first doped layer and a second doped layer may be separately formed in each fin structure on the two sides of the corresponding gate structure (S503).

In one embodiment, for each fin structure, the second doped layer may be formed after forming the first doped layer. For example, the first doped layer may be formed in the fin structure 101 on one side of the corresponding gate structure 110. The first doped layer may be made of a first semiconductor material and doped with first doping ions. After forming the first doped layer, the second doped layer may be formed in the fin structure 101 on the other side of the gate structure 110. The second doped layer may be made of a second semiconductor material and doped with second doping ions. The doping type of the second doping ions may be different from the doping type of the first doping ions.

For example, the first doped layer may be formed by a process including the following steps. First, a first opening may be formed in the fin structure 101 on one side of the gate structure. Then, a first semiconductor layer may be formed in the first opening by filling the first opening with the first semiconductor material. The first semiconductor layer may be doped with first doping ions to form the first doped layer.

After forming the first doped layer, the second doped layer may then be formed by a process including the following step. First, a second opening may be formed in the fin structure 101 on the other side of the gate structure 110. Then, a second semiconductor layer may be formed in the second opening by filling the second opening with the second semiconductor material. The second semiconductor layer may be doped with second doping ions to form the second doped layer.

The fabrication process for the first semiconductor layer and the fabrication process for the second semiconductor layer may include using a deposition method or an epitaxial method to form the first semiconductor layer and/or the second semiconductor layer.

In one embodiment, the first doped layer and the second doped layer may respectively serve as the source region and the drain region of the subsequently-formed transistor. The fabrication process for the first doped layer and the fabrication process for the second doped layer may include using an in-situ implantation process to implant the first doping ions into the first semiconductor layer and/or implant the second doping ions into the second semiconductor layer.

In one embodiment, the transistors to be formed are TFETs. During the fabrication process for the second doped layer, the second semiconductor material and the first semiconductor material may not be the same. For example, the first semiconductor material may include N-type InAs, InAsSb, InGaAs, etc. while the second semiconductor material may include Ge, SiGe, GeSn, GaSb etc.

In addition, in other embodiments, during the fabrication process for the second doped layer, the doping concentration in the second doped layer may be different from the doping concentration in the first doped layer.

Because the first doped layer and the second doped layer may be formed separately, the formation process for the first doped layer may not affect the formation process for the second doped layer, and vice versa. That is, the fabrication process for the first doped layer and the fabrication process for the second doped layer may be independent from each other, and thus may not affect each other. Therefore, the selection ranges for the materials and the doping properties of the first doped layer and the second doped layer may be expanded such that the process window for forming the transistors may be enlarged, and the performance of the formed transistors may also be improved.

Further, by using different materials and different doping concentrations to form the first doped layer and the second doped layer, the conduction current in the formed TFET may be optimized, and thus the ambipolar conduction characteristics in the TFET may be suppressed.

In one embodiment, referring to FIG. 2, the substrate may include a first fin structure 101p in a first region 100p and a second fin structure 101n in a second region 100n. Therefore, a first doped layer and a second doped layer may be formed in the first fin structure 101p and also in the second fin structure 101n. FIGS. 3-6 show schematic cross-section views of the semiconductor structures at certain stages during the fabrication process of the first doped layer and the second doped layer in both the first fin structure 101p and the second fin structure 101n.

Figure 3:
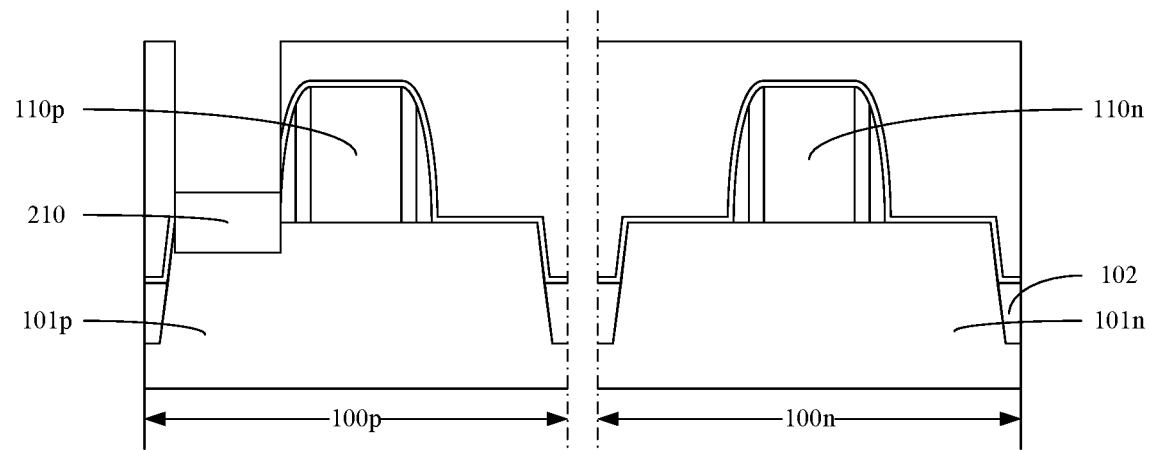

Referring to FIG. 3, during the process to form the first doped layer in the first fin structure 101p, a first source region 210 may be formed in the first fin structure 101p on one side of the first gate structure 110p. The first source region 210 may be made of a first material and doped with first ions.

The process for forming the first source region 210 may include the following steps. First, a third opening may be formed in the first fin structure 101p on one side of the first gate structure 110p by etching the interlayer dielectric layer and the first fin structure 101p. Then, a first material may be filled into the third opening through an epitaxial growth process. During the epitaxial growth of the first material, an in-situ doping process may be performed to simultaneously implant the first ions into the first material to form the first source region 210.

In one embodiment, the first source region 210 may be the first doped layer formed in the first region 100p of the transistor. The first source region 210 may be used to form the source region of a subsequently-formed P-type TFET. Therefore, the first material may be a first semiconductor material including InAs, InAsSb, GaInAsSb, etc. The first ions may be N-type ions including phosphor ions, arsenic ions, tellurium ions, etc.

Figure 4:
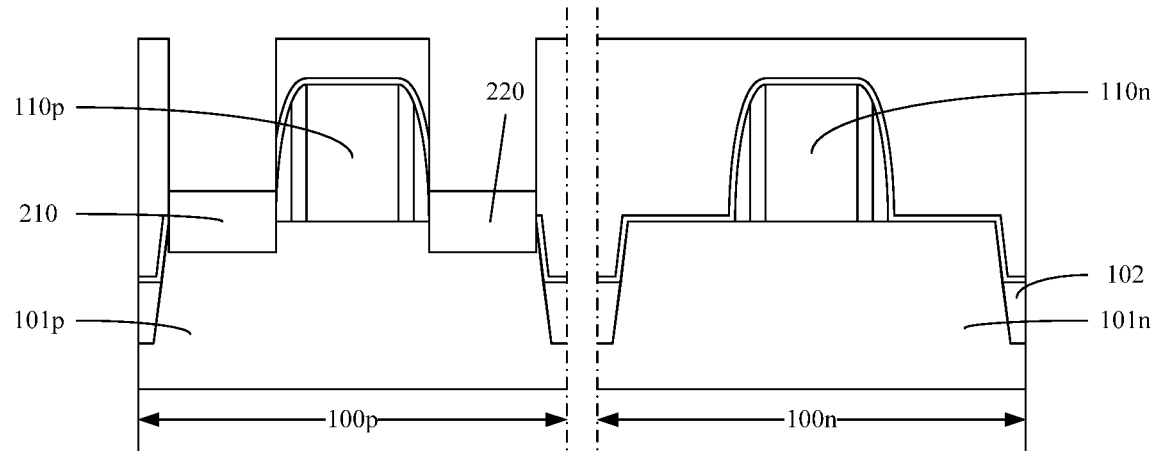

Referring to FIG. 4, during the process to form the second doped layer in the first fin structure 101p, a first drain region 220 may be formed in the first fin structure 101p on the other side of the first gate structure 110p. The first drain region 220 may be made of a second material and doped with second ions. The type of the first ions may be different from the type of the second ions.

The process for forming the first drain region 220 may include the following steps. First, a fourth opening may be formed in the first fin structure 101p on the other side of the first gate structure 110p by etching the interlayer dielectric layer and the first fin structure 101p. Then, a second material may be filled into the fourth opening through an epitaxial growth process. During the epitaxial growth of the second material, an in-situ doping process may be performed to simultaneously implant second ions into the second material to form the first drain region 220.

In one embodiment, the first drain region 220 may be the second doped layer formed in the first region 100p of the transistor. The first drain region 220 may be used to form the drain region of a subsequently-formed P-type TFET. Therefore, the second material may be a second semiconductor material including Ge, SiGe, GeSn, GaSb, etc. The second ions may be P-type ions including boron ions, gallium ions, indium ions, etc.

Figure 5:
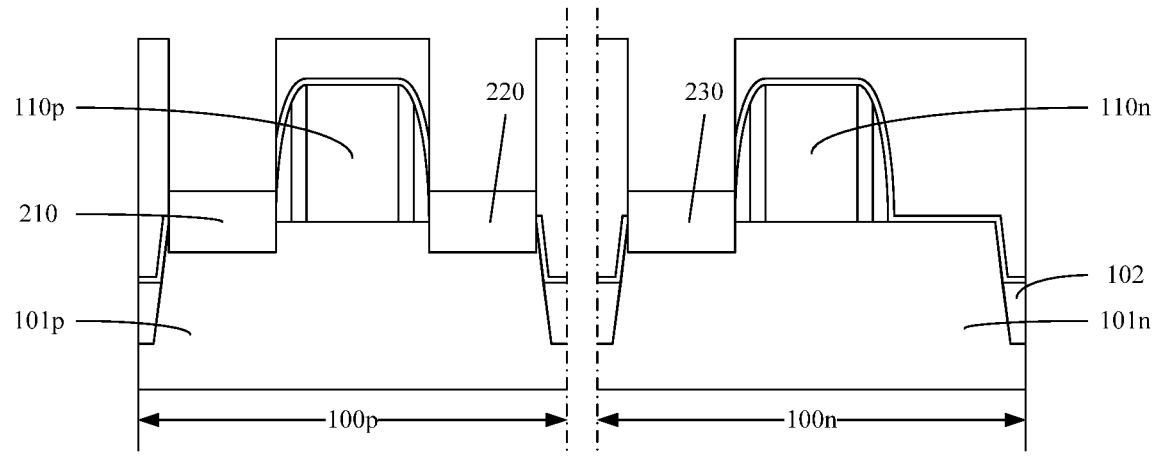

Referring to FIG. 5, a second source region 230 may then be formed in the second fin structure 101n on one side of the second gate structure 110n. The second source region 230 may be made of a third material and doped with third ions.

The process for forming the second source region 230 may include the following steps. First, a fifth opening may be formed in the second fin structure 101n on one side of the second gate structure 110n by etching the interlayer dielectric layer and the second fin structure 101n. Then, a third material may be filled into the fifth opening through an epitaxial growth process. During the epitaxial growth of the third material, an in-situ doping process may be performed to simultaneously implant third ions into the third material to form the second source region 230.

In one embodiment, the second source region 230 may be used to form the source region of a subsequently-formed N-type TFET. The third material may include Ge, SiGe, GeSn, GaSb, etc. The third ions may be P-type ions including boron ions, gallium ions, indium ions, etc.

Figure 6:
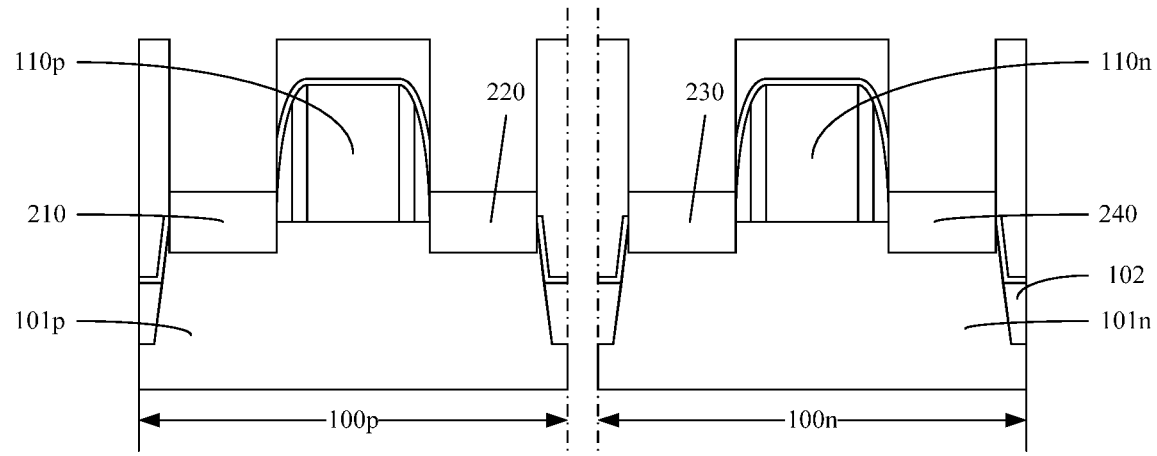

Further, referring to FIG. 6, a second drain region 240 may be formed in the second fin structure 101n on the other side of the second gate structure 110n. The second drain region 240 may be made of a fourth material and doped with fourth ions.

The process for forming the second drain region 240 may include the following steps. First, a sixth opening may be formed in the second fin structure 101n on the other side of the second gate structure 110n by etching the interlayer dielectric layer and the second fin structure 101n. Then, a fourth material may be filled into the sixth opening through an epitaxial growth process. During the epitaxial growth of the fourth material, an in-situ doping process may be performed to simultaneously implant fourth ions into the fourth material to form the second drain region 240.

In one embodiment, the second drain region 240 may be used to form the drain region of a subsequently-formed N-type TFET. Therefore, the fourth material may include InAs, InAsSb, GaInAsSb, etc. The fourth ions may be N-type ions including phosphor ions, arsenic ions, tellurium ions, etc.

In one embodiment, as described above, the first source region 210, the second source region 230, the first drain region 220, and the second drain region 240 may be separately formed by four fabrication processes.

In other embodiment, the first source region, the second source region, the first drain region, and the second drain region may not be separately formed by four independent fabrication processes. For example, when the fourth material is the same as the first material while the fourth ions are also the same as the first ions, the second drain region may be formed simultaneously with the first source region. In addition, when the third material is the same as the second material while the third ions are also the same as the fourth ions, the second source region may be formed simultaneously with the first drain region. When doped layers made of a same material and doped with same ions are fabricated simultaneously, the fabrication steps may be reduced, the semiconductor process may be simplified and, thus, the productivity may be increased.

In one embodiment, the transistors to be formed are HKMG transistors. Therefore, after forming the first doped layer and the second doped layer, the fabrication method may further include subsequent process to remove the dummy gate structures and then form HKMG structures.

Figure 7:
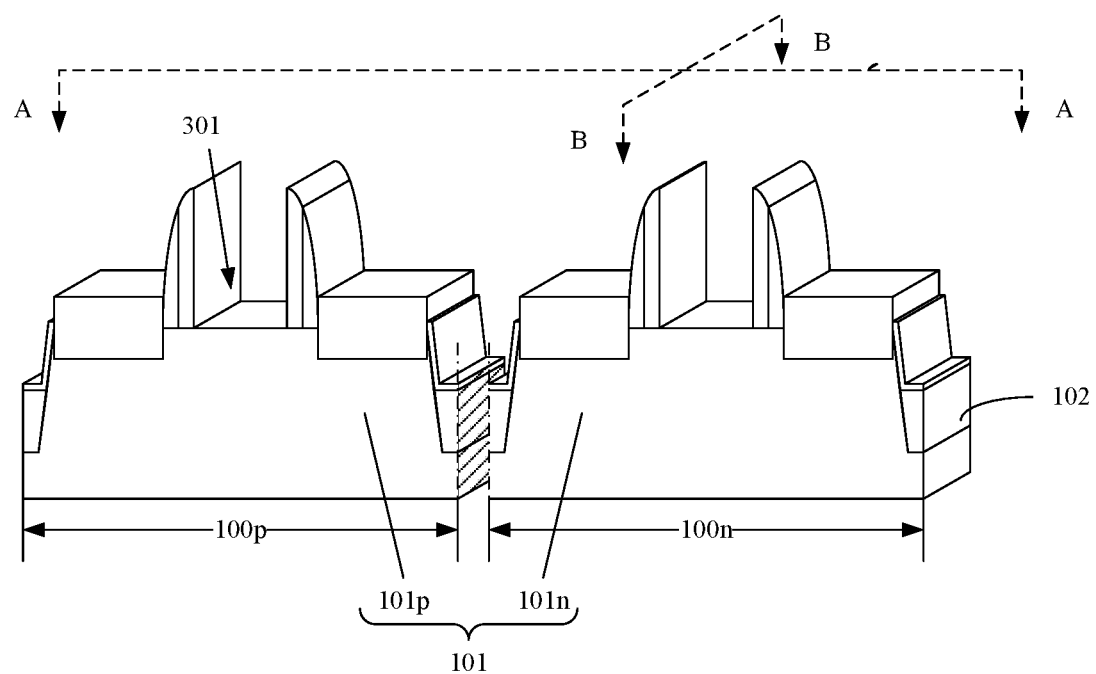
Figure 8:
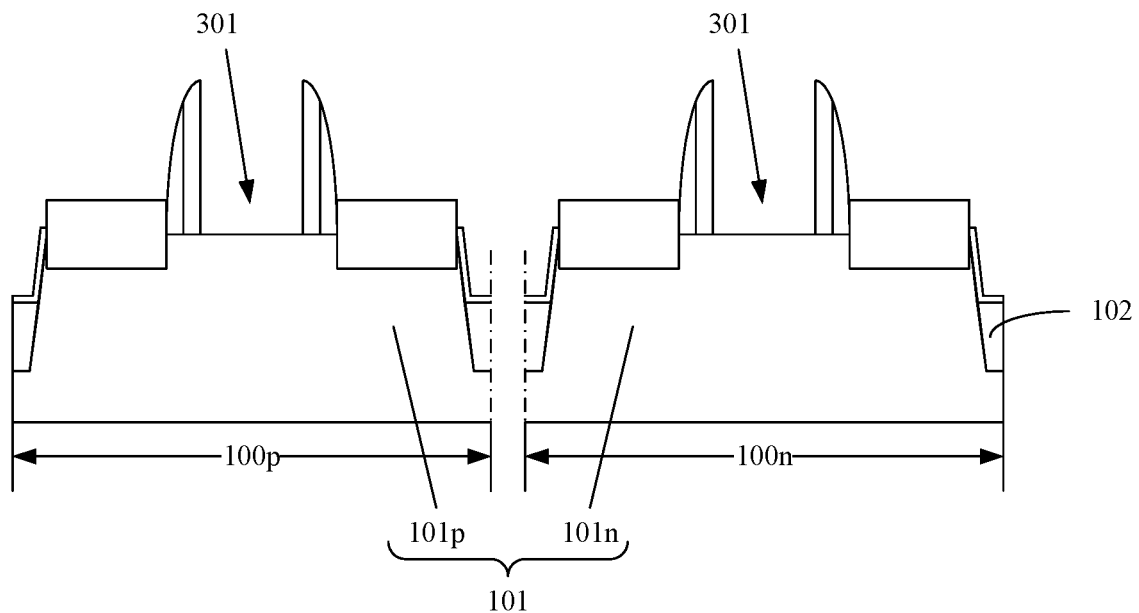
Figure 9:
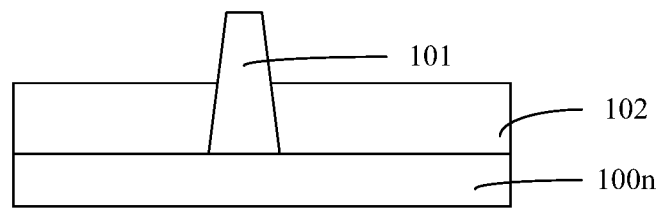

Returning to FIG. 15, further, the gate structures formed on the fin structures may be removed (S504). FIG. 7 shows a schematic three-dimension view of the semiconductor structure after removing the gate structures. FIG. 8 shows a cross-section view of the semiconductor structure shown in FIG. 7 along an AA line (e.g., along a length direction of the fin structures) while FIG. 9 shows a cross-section view of the semiconductor structure shown in FIG. 7 along a BB line (e.g., along direction perpendicular to the length direction of the fin structures). For illustration purposes, the interlayer dielectric layer is not shown in FIGS. 7-9.

Referring to FIGS. 7-9, the gate structures (referring to FIG. 2) formed on the fin structures 101 may be removed. In one embodiment, the transistors to be formed are HKMG transistors. Therefore, the gate structures initially formed on the fin structures 101 may be dummy gate structures and thus may be removed to allow further formation of HKMG structures. After removing each gate structure, a seventh opening 301 may be formed to expose a portion of the surface of the corresponding fin structure 101.

For example, the seventh opening 301 may be formed on each first fin structure by removing the first gate structure and the second gate structure using a dry etching method. The seventh opening 301 formed in the first region 100p may expose a portion of the top and sidewall surfaces of the first fin structure 101p and the seventh opening 301 formed in the second region 100n may expose a portion of the top and sidewall surfaces of the second fin structure 101n.

Figure 10:
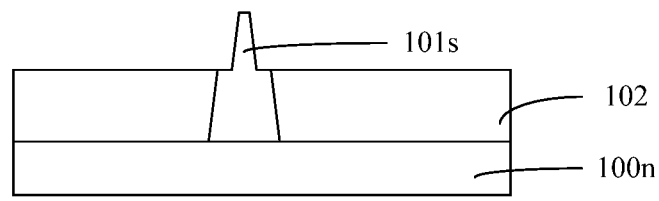

Further, returning to FIG. 15, a thinning-down process may be performed on the exposed top and sidewall surfaces of each fin structure to form a channeled substrate (S505). FIG. 10 shows a schematic cross-section view of the corresponding structure after the thinning-down process.

Referring to FIG. 10, a thinning-down process may be performed on the exposed portion of top and sidewall surfaces of each fin structure 101 (referring to FIG. 9) to form a channeled substrate 101s. In one embodiment, a dry etching method may be used in the thinning-down process. For example, during the formation process for the channeled substrate 101s, a portion of the surface layer of the fin structure may be removed to reduce the height and the width of the fin structure 101 and, thus form a channeled substrate 101s. In one embodiment, the thickness of the portion of top and sidewall surfaces of the fin structure 101 removed in the thinning-down process may be in a range of 3 nm to 5 nm.

In other embodiments, during the formation process for the channeled substrate, a sidewall portion of the exposed fin structure in the seventh opening may be etched and removed. The thinning-down process may stop at an interface surface with the isolation layer 102. In other words, the etched sidewall of the fin structure 101 after the thinning-down process, or the channeled substrate 101s, may have a bottom surface leveled with the isolation layer 102.

Figure 11:
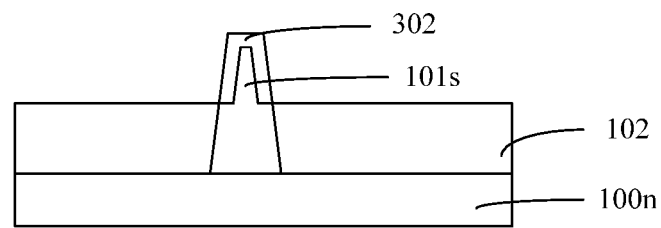

Further, returning to FIG. 15, a channel layer may be formed to cover the surface of the channeled substrate, and the surface of the channel layer together with the sidewall surfaces of the seventh opening may define an eighth opening (S506). FIG. 11 shows a schematic cross-section view of the corresponding semiconductor structure.

Referring to FIG. 11, a channel layer 302 may be formed to cover the surface of each channeled substrate 101s. The surface of the channel layer 302 together with the sidewall surfaces of the seventh opening may define a eighth opening. That is, the seventh opening and the eighth opening may have different bottom surfaces: the bottom surface of the seventh opening is a portion of the surface of the fin structure 101, while the bottom surface of the eighth opening is the surface of the channel layer 302.

After removing the surface portion of the fin structure 101 (referring to FIG. 9), a portion of the fin structure 101 may still remain. The remaining portion of the fin structure 101 may serve as growth substrate for the formation of the channel layer 302. As such, the quality of the formed channel layer 302 may be improved and the performance of the formed transistor may also be improved.

The channel layer 302 may be used to provide a tunneling channel for the subsequently-formed TFET. Therefore, the material used for forming the channel layer 302 may be a material with high carrier mobility. For example, the channel layer 302 may be formed by a material including one of SiGe, Ge, and InAs. The channel layer 302 may cover the top and sidewall surfaces of the channeled substrate 101s.

In one embodiment, by removing the dummy gate structure, thinning-down the fin structure, and then forming the channel layer through an epitaxial growth process, the material used for forming the channel layer may be selectable, the process window for forming the transistor may be enlarged, and the performance of the formed transistor may also be improved.

Moreover, after forming the channel layer 302, a restoration treatment process may be performed on the channel layer 302 to let the channel layer 302 have a similar morphology as the fin structure 101 prior to the thinning-down process (referring to FIG. 9). As such, the performance of the formed transistor may be improved. For example, a dry etching process may be used during the restoration treatment process.

Figure 12:
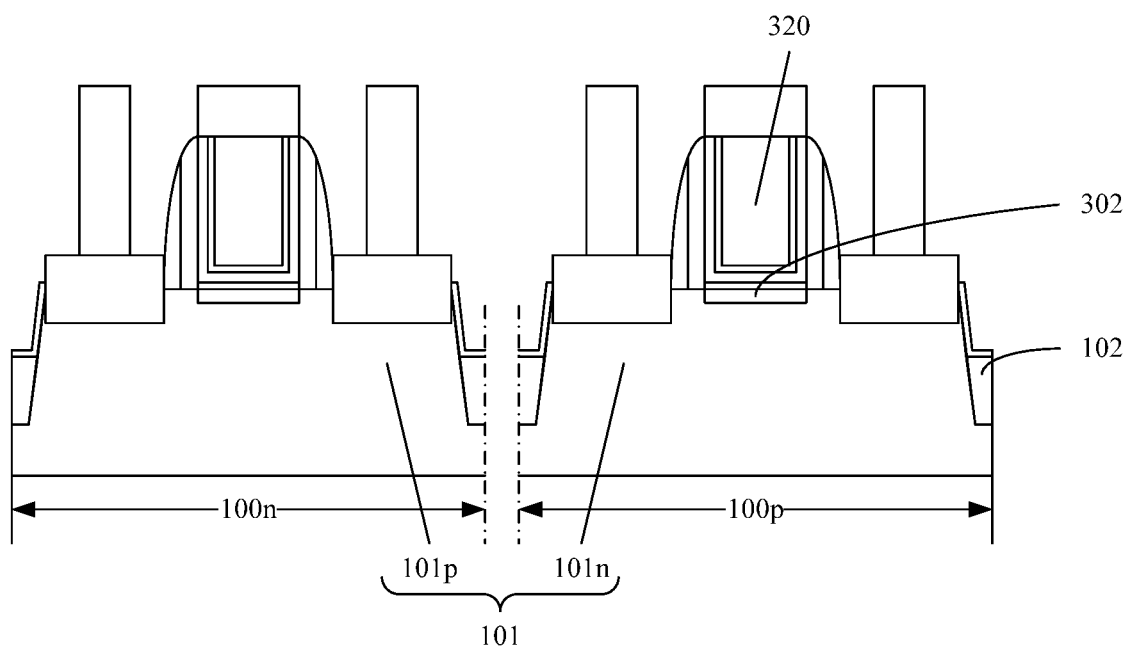

Further, returning to FIG. 15, a metal gate structure may be formed on the channel layer exposed in each eighth opening (S507). FIG. 12 shows a schematic cross-section of a corresponding semiconductor structure.

Referring to FIG. 12, a metal gate structure 320 may be formed in each eighth opening. For example, the metal gate structure 320 may include a gate dielectric layer, a barrier layer, an adhesion layer, and a metal gate electrode consecutively formed on the channel layer 302. The gate dielectric layer may be formed by a high-k dielectric material; the barrier layer may be made of a material including titanium aluminide; the adhesion layer may be made of a material including $TiN_x$. The metal gate structure 320 may be formed by any appropriate process.

Figure 13:
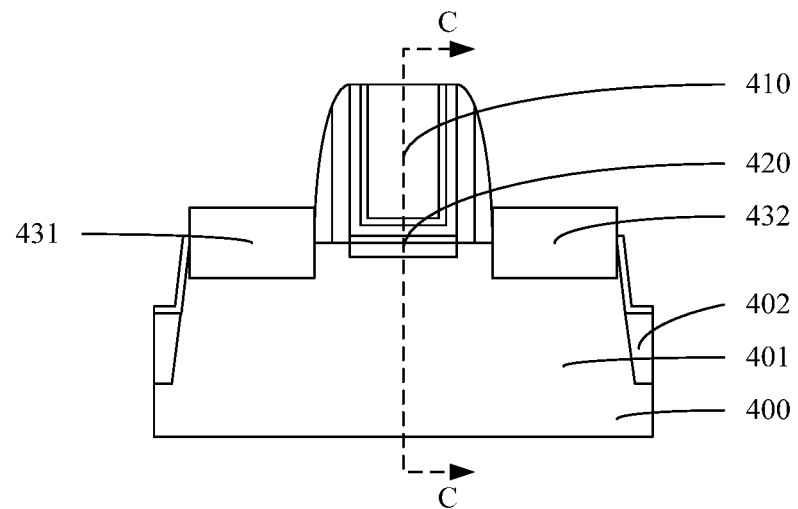
FIGS. 13-14 illustrates schematic views of an exemplary transistor consistent with disclosed embodiments.
Figure 14:
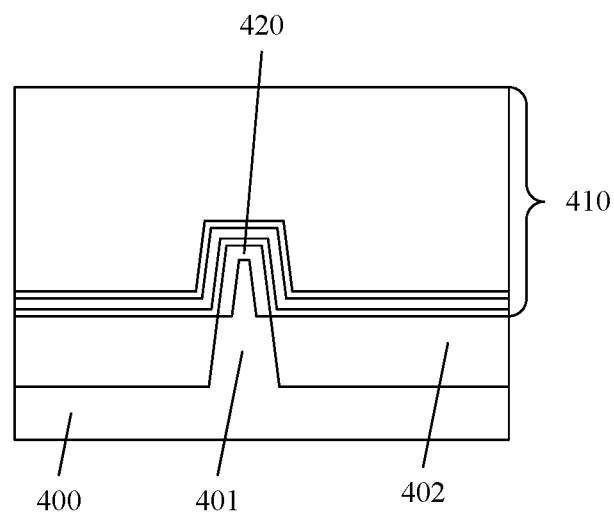

Corresponding to the fabrication methods described above, the present disclosure also includes a transistor. FIGS. 13-14 show schematic views of a TFET consistent with disclosed embodiments. For example, FIG. 13 shows a cross-section view of the transistor along a direction parallel to the extending direction of the fin structure; FIG. 14 shows a cross section view of the transistor along a CC line shown in FIG. 13.

Referring to FIGS. 13-14, the transistor includes a substrate 400 and a fin structure 401 formed on the surface of the substrate 400. The substrate 400 may be used as an operation platform during the fabrication process for the transistor. The fin structure 401 may be used to form the TFET.

The substrate 400 may be made of single crystalline silicon, polycrystalline silicon, or amorphous silicon. In addition, the substrate 400 may be made of Ge, GaAs, or SiGe. Moreover, the substrate 400 may also be made of any other appropriate semiconductor material.

In one embodiment, the substrate 400 and the fin structures 401 are both made of single crystalline silicon. In addition, the TFET is a Fin-FET. Therefore, a first doped layer and a second doped layer used to respectively form the source region and the drain region of the transistor may be formed in the fin structure 401. By using single crystalline silicon for the substrate 400 and also for the fin structure 401, structural defects in the formed first doped layer and the second doped layer may be reduced, which may be conducive to improving the quality of the first doped layer and the second doped layer, and may also help improve the performance of the formed TFET.

Moreover, by using single crystalline silicon for the substrate 400 and the fin structure 401, the disclosed fabrication method may be compatible with existing main-stream transistor fabrication technology and, thus, no significant changes may be required for existing production lines in order to realize the disclosed fabrication method. That is, neither extra fabrication process nor extra cost may be required to fabricate the disclosed transistor.

Moreover, a plurality of the disclosed transistor may be simultaneously fabricated. Therefore, in one embodiment, in order to ensure electrical isolation between neighboring fin structures 401, the transistor may also include an isolation layer 402 formed on the substrate 400 between neighboring fin structures 401 during the fabrication process. The top surface of the isolation layer 402 may be lower than the top surface of the fin structure 401 such that a portion of the sidewall surfaces of the fin structure 401 may be exposed.

The transistor may include a gate structure 410 formed on the fin structure. The gate structure 410 may be formed across the fin structure and situated on a portion of the top and sidewall surfaces of the fin structure 401.

The gate structure 410 may be the gate structure of the TFET. For example, the gate structure 410 may be a metal gate structure including a gate dielectric layer, a barrier layer, an adhesion layer, and a metal gate electrode consecutively formed on the fin structure 401. The gate dielectric layer may be formed by a high-k dielectric material; the barrier layer may be made of a material including titanium aluminide; the adhesion layer may be made of a material including $TiN_x$. The metal gate structure 410 may be formed by any appropriate process.

In one embodiment, the transistor may also include a channel layer 420 formed between the fin structure 401 and the gate structure 410. That is, the channel layer 420 may be formed on the fin structure 401, and then the bottom layer of the gate structure 410, i.e. the gate dielectric layer, may be formed on the channel layer 420.

The channel layer 420 may be used to provide a tunneling channel for the TFET. Therefore, the material used for forming the channel layer 420 may be a material with high carrier mobility. For example, the channel layer 420 may be formed by a material including one of SiGe, Ge, and InAs. The channel layer 420 may cover the top and sidewall surfaces of the fin structure 401.

In one embodiment, the dimensions of the portion of the fin structure 410 covered by the channel layer 420 may be smaller than the dimensions of the portion of the fin structure 410 not covered by the channel layer 420, although in other embodiments, the dimensions of the portion of the fin structure 410 covered by the channel layer 420 may not be smaller than the dimensions of the portion of the fin structure 410 not covered by the channel layer 420. In addition, in some embodiments, the top surface of the portion of the fin structure 410 under the channel layer 420 may be leveled with the top surface of the isolation layer 402.

The transistor may also include a first doped layer 431 formed in the fin structure 401 on one side of the gate structure 410 and a second doped layer 432 formed in the fin structure 401 on the other side of the gate structure 410. The first doped layer 431 may be made of a first semiconductor material and doped with first doping ions. The second doped layer 432 may be made of a second semiconductor material and doped with second doping ions. Further, the dopant type of the first doping ions may be different from the dopant type of the second doping ions, while the first semiconductor material may also be different from the second semiconductor material.

The first doped layer 431 and the second doped layer 432 may be used to respectively form the source region and the drain region of the transistor. In one embodiment, the transistor is a TFET. Therefore, the dopant type of the first doping ions may be different from the dopant type of the second doping ions.

Moreover, the second semiconductor material used to form the second doped layer 432 may be different from the first semiconductor material used to form the first doped layer 432. For example, the first semiconductor material may include N-type InAs, $InAs_xSb_{1-x}$, InGaAs, etc.; while the second semiconductor material may include Ge, SiGe, GeSn, GaSb, etc. By selecting different materials for forming the first doped layer 431 and the second doped layer 432, the process window for forming the transistor may be enlarged, while the performance of the formed transistor may also be improved.

Moreover, during the formation process, by using different materials and different doping concentrations to form the first doped layer and the second doped layer, the conduction current may be optimized in the formed TFET, and thus the ambipolar conduction characteristics in the formed TFET may also be suppressed.

Compared to existing TFETs and fabrication methods, the disclosed transistors and fabrication methods may demonstrate several advantages.

According to the disclosed transistors and fabrication methods, a first doped layer containing first doping ions may be formed in the fin structure on one side of the gate structure and a second doped layer containing second doping ions may be formed in the fin structure on the other side of the gate structure. The disclosed fabrication methods may include forming the first doped layer and the second doped layer separately by two different fabrication processes. That is, the fabrication process for the first doped layer and the fabrication process for the second doped layer may be independent to each other. Therefore, the selection ranges for the materials and the doping properties of the first doped layer and the second doped layer may be expanded, and thus the performance of the formed transistor may be improved.

Further, the disclosed transistor may be a TFET. The first doped layer and the second doped layer may be situated in the fin structure. The gate structure may cover a portion of the top and sidewall surfaces of the fin structure. Therefore, the disclosed fabrication methods may be used to form TFET with a fin structure so that the ability of the formed TFET in controlling the gate electrode may be improved, and thus the performance of the TFET may be improved.

Moreover, the gate structure of the disclosed transistor may be formed after removing a previously-formed dummy gate structure and forming the channel layer. For example, the dummy gate structure may be removed to expose a portion of the surface of the fin structure after forming the second doped layer. The fin structure may then be treated by an etching process before forming the channel layer. As such, the selection ranges for the material and the doping properties of the channel layer may be expanded, which may further be conducive to improving the performance of the formed TFET.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A transistor, comprising:
a substrate;
at least one fin structure formed on the substrate;
an isolation layer formed on the substrate and surrounding the at least one fin structure;
a channeled substrate formed on the at least one fin structure, wherein a bottom surface of the channeled substrate is leveled with a top surface of the isolation layer;
a channel layer formed on a top surface and side surfaces of the channeled substrate;
at least one gate structure formed across the at least one fin structure and covering a portion of top surface and sidewall surfaces of the at least one fin structure, wherein the channel layer is sandwiched directly by the channeled substrate and the at least one gate structure;
a first doped layer formed in the at least one fin structure on one side of the at least one gate structure and made of a first semiconductor material and doped with first doping ions at a first doping concentration; and
a second doped layer formed in the at least one fin structure on another side of the at least one gate structure, made of a second semiconductor material, doped with second doping ions at a second doping concentration,
wherein the first semiconductor material, the first doping ions and the first doping concentration are different from the second semiconductor material, the second doping ions and the second doping concentration, respectively.

2. The transistor according to claim 1, wherein a dimension of a portion of the at least one fin structure covered by the channel layer is smaller than a dimension of a remaining portion of the at least one fin structure without being covered by the channel layer.

3. The transistor according to claim 2,
wherein:
the top surface of the isolation layer is lower than the top surface of the at least one fin structure, and a portion of the sidewall surfaces of the at least one fin structure is exposed;
an upper surface of a portion of the at least one fin structure under the at least one gate structure is leveled with the top surface of the isolation layer; and
the top surface of the isolation layer is leveled with the upper surface of the remaining portion of the at least one fin structure without being covered by the channel layer.

4. The transistor according to claim 1, wherein:
the channel layer is made of a material including SiGe, Ge, and InAs.

5. The transistor according to claim 1, wherein:
the first semiconductor material is an N-type and includes InAs, InAsSb, and InGaAs; and
the second semiconductor material is a P-type and includes Ge, SiGe, GeSn, and GaSb.

6. The transistor according to claim 1, wherein:
the substrate includes a first region used to form a first type transistor and a second region used to form a second type transistor; and
the at least one fin structure includes:
a first fin structure formed on the substrate in the first region; and
a second fin structure formed on the substrate in the second region.

7. The transistor according to claim 6, wherein:
the at least one gate structures includes:
a first gate structure on the first fin structures;
a second gate structure on the second fin structures;
a first source region in the first fin structure on one side of the first gate structure, wherein the first source region is made of a first material and doped with first ions;
a first drain region in the first fin structure on the other side of the first gate structure, wherein the first drain region is made of a second material and doped with second ions, and the second ions are different from the first ions;
a second source region in the second fin structure on one side of the second gate structure, wherein the second source region is made of a third material and doped with third ions; and
a second drain region in the second fin structure on the other side of the second gate structure, wherein the second drain region is made of a fourth material and doped with fourth ions, and the fourth ions are different from the third ions.

8. The transistor according to claim 7, wherein:
the first material is the same as the fourth material;
the first ions are the same as the fourth ions; and
the second drain region is formed simultaneously with the first source region.

9. The transistor according to claim 7, wherein:
the second material is the same as the third material;
the second ions are the same as the third ions; and
the second source region is formed simultaneously with the first drain region.

10. The transistor according to claim 1, wherein:
the top surface of the isolation layer is lower than the top surfaces of the at least one fin structures, and a portion of the sidewall surfaces of the at least one fin structure is exposed.

* * * * *